United States Patent
Doellgast et al.

(10) Patent No.: US 7,982,373 B2
(45) Date of Patent: Jul. 19, 2011

(54) PIEZOELECTRIC MULTILAYER COMPONENT

(75) Inventors: Bernhard Doellgast, Deutschlandsberg (AT); Johann Schmidt, Graz (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 12/616,576

(22) Filed: Nov. 11, 2009

(65) Prior Publication Data

US 2010/0141098 A1 Jun. 10, 2010

Related U.S. Application Data

(63) Continuation of application No. PCT/EP2008/055720, filed on May 8, 2008.

(30) Foreign Application Priority Data

May 11, 2007 (DE) .......................... 10 2007 022 091
Aug. 8, 2007 (DE) .......................... 10 2007 037 500

(51) Int. Cl.
*H01L 41/083* (2006.01)
(52) U.S. Cl. .................... 310/366; 310/363; 310/328
(58) Field of Classification Search .................. 310/328, 310/363, 366
See application file for complete search history.

(56) References Cited

U.S. PATENT DOCUMENTS

| | | | |
|---|---|---|---|
| 7,358,655 B2 | 4/2008 | Ragossnig et al. | |
| 7,449,077 B2 * | 11/2008 | Heinzmann et al. | 156/89.12 |
| 7,598,660 B2 | 10/2009 | Kobayashi et al. | |
| 7,851,974 B2 * | 12/2010 | Dollgast et al. | 310/328 |
| 2004/0145276 A1 * | 7/2004 | Cramer et al. | 310/328 |
| 2006/0055288 A1 * | 3/2006 | Heinzmann et al. | 310/364 |
| 2008/0315717 A1 | 12/2008 | Schroder et al. | |
| 2009/0278422 A1 * | 11/2009 | Florian et al. | 310/326 |
| 2010/0019620 A1 * | 1/2010 | Kastl et al. | 310/311 |
| 2010/0102138 A1 * | 4/2010 | Denzler et al. | 239/1 |

FOREIGN PATENT DOCUMENTS

| | | |
|---|---|---|
| DE | 102 34 787 C1 | 10/2003 |
| DE | 103 07 825 A1 | 9/2004 |
| DE | 10 2004 031 404 A1 | 2/2006 |
| DE | 102005021275 A1 * | 11/2006 |
| EP | 1 764 844 A1 | 3/2007 |
| EP | 1 850 403 A1 | 10/2007 |
| EP | 1 944 813 A1 * | 7/2008 |
| WO | WO 03/105246 A2 | 12/2003 |
| WO | WO 2006/042791 A1 * | 4/2006 |
| WO | WO 2006/087871 A1 | 8/2006 |
| WO | WO 2007/048756 A1 | 5/2007 |

* cited by examiner

*Primary Examiner* — Thomas M Dougherty
(74) *Attorney, Agent, or Firm* — Slater & Matsil, L.L.P.

(57) ABSTRACT

A piezoelectric multilayer component has a base body including a stack of dielectric layers, electrode layers and at least one predetermined breaking layer. The predetermined breaking layer is arranged at least for the most part in an inactive zone of the multilayer component and cracks under specific tensile loads.

20 Claims, 2 Drawing Sheets

PIEZOELECTRIC MULTILAYER COMPONENT

This application is a continuation of co-pending International Application No. PCT/EP2008/055720, filed May 8, 2008, which designated the United States and was not published in English, and which claims priority to German Application No. 10 2007 022 091.1 filed May 11, 2007 and 10 2007 037 500.1 filed Aug. 8, 2007, each of which is incorporated herein by reference in its entirety.

TECHNICAL FIELD

Aspects of the invention relate to a piezoelectric multilayer component.

BACKGROUND

WO 2006/087871 A1 describes a piezoelectric multilayer component having electrode layers which induce a crack between the electrode layers and adjacent ceramic layers.

SUMMARY

In one aspect, the invention specifies a piezoelectric multilayer component which remains functional under mechanical loading over a longer period of time. In one embodiment, a piezoelectric multilayer component includes a layer which cracks under specific mechanical loads and thus counteracts the build-up of stresses in the multilayer component.

A piezoelectric multilayer component includes a base body comprising a stack of dielectric layers, electrode layers and at least one mechanical unstable layer. The mechanically unstable layer is arranged at least for the most part in an inactive zone or in an inactive region which is situated in a region of the multilayer component in which adjacent electrode layers in orthogonal projection do not overlap or an electric field does not lead, or at least only slightly leads, to the deflection of the stack in this region. The mechanically unstable layer can be referred to as predetermined breaking layer.

Predetermined breaking layer is understood to mean both the layer containing a predetermined breaking material before the completion of the multilayer component and the predetermined breaking layer during and/or after the completion of the multilayer component.

The predetermined breaking layer cracks under specific mechanical loads during operation or during polarization of the component and thus reduces mechanical stresses in the multilayer component, particularly in the inactive zone.

Advantageously, as a result of the predetermined breaking layer, cracks form only in the inactive zone of the multilayer component. The maximum propagation of the cracks is determined by dimensions of the predetermined breaking layers. Therefore, cracks also cannot continue transversely through the multilayer component. A multilayer component having high long-term stability is thus created, where the long-term stability advantageously does not have the consequence that, by way of example, the deflection distance of the multilayer component is reduced. This last could instead occur if cracks run transversely through the stack, since the cracks would then also run through the deflecting active zone of the multilayer component.

Under normal circumstances, the inactive zone of the multilayer component is not subjected to strong electromagnetic or electric fields, with the result that a piezoelectric deflection effect does not occur, or at least only occurs to a small extent.

However, mechanical stresses thus form between the deflecting active zone and the non-expanding inactive zone. Since the predetermined breaking layers, by virtue of their ability to crack in a controlled manner, enable the stresses to be reduced, a clamping effect in the inactive zone is avoided. This likewise contributes to the long-term stability of the multilayer component.

In accordance with one embodiment of the multilayer component, the latter has external contacts. The latter can be applied as electrically conductive layers to a side area of the stack and be contact-connected to electrode layers led out as far as a corresponding side area of the stack.

If the inactive zone, on account of the expansion of the active zone of the multilayer component that is connected to it, endeavors to allow itself to spread apart, an existing electrical contact of an electrode layer to an external contact would be threatened by interruption. To put it another way, the inactive zone clamps the active zone relative to its longitudinal expansion, or the active zone experiences clamping by the non-deflecting or only slightly deflecting inactive zone. This gives rise to mechanical stresses which could lead in uncontrolled fashion to the destruction or damage of at least part of the multilayer component.

However, the mechanically unstable layers enable the electrode layers to be reliably contact-connected to external contacts. Each predetermined breaking layer of the inactive zone permits the targeted reduction of mechanical stress between the electrode layer and the external contact by virtue of the fact that a crack runs alongside an electrode layer. As a result, at least part of the mechanical stress on the contact location between the external contact and the electrode layer can be absorbed or compensated for by the crack.

The constitution of the predetermined breaking layer is chosen in such a way that it enables the predetermined breaking layer to crack in the event of tensile stresses acting on it. By way of example, the predetermined breaking layer can have holes, indentations and/or an inhomogeneous solid distribution such as, for example, a crystal structure having one interruption or a plurality of interruptions. The predetermined breaking layer can contain a ceramic material, in particular, an organic material and/or a metal.

In accordance with one embodiment of the multilayer component, the predetermined breaking layer can include a material which is diffusible through the dielectric layers during the production of the stack. Advantageously, the material microstructure of the predetermined breaking layer is weakened on account of the outdiffused material in such a way that the predetermined breaking layer can crack in the event of tensile loads. In this case, the predetermined breaking layer can contain a material composition that includes a material which is readily diffusible from the predetermined breaking layer and a material which is poorly diffusible from the predetermined breaking layer.

A diffusion of material from the predetermined breaking layer can be initiated by means of a process which enables the compensation or cancellation of a concentration gradient of this material in a space within the multilayer component. A higher concentration of a material in the predetermined breaking layer in comparison with other regions of the multilayer component entails the higher probability of the material of the predetermined breaking layer migrating in the direction of lower concentration. The differences in the diffusion coefficients of the material contained in the predetermined breaking layer in comparison with another region or other regions of the multilayer component can also be taken into account in order to impart to the predetermined breaking layer the required predetermined breaking property thereof.

Since the diffusion coefficient is dependent on temperature and/or pressure, these influences can be taken into account in the choice of the material of the predetermined breaking layer.

By way of example, should the predetermined breaking layer contain $10^{10}$ diffusible particles of a first type, that is to say particles which are freely mobile and are also not detained in a crystal structure, and should another region of the multilayer component have a lower or no concentration at all of the particles in a region, that is to say $10^8$ particles, for example, then the probability is greater by a factor of 100 that particles of the mechanical unstable layer will randomly migrate in the direction of lower or lacking concentration.

By way of example, the diffusion could take place during heating, for example before or during sintering, of the stack or be supported thereby. In particular, the diffusion process can be accelerated by a supply of heat. Given a suitable supply of heat, the particles of the predetermined breaking layer can separate from bonds among one another or with other materials of the predetermined breaking layer in order to be able to diffuse through the multilayer component.

A supply of heat should be regarded as an external supply of energy, with the result that an increase, expressed by the diffusion, of entropy in the multilayer component by virtue of material concentration gradients canceling one another out, for example, does not necessarily have to take place. By means of the supply of heat, a thermal gradient or thermal gradients can be produced which compel loose or outdiffusible particles from the predetermined breaking layers into regions of the multilayer component at a lower temperature. In this case, the diffusion can be referred to as active diffusion.

In accordance with one embodiment of the multilayer component, specifically the dielectric layers of the stack contain material or materials in different concentrations than are present in the predetermined breaking layer. This results in a concentration gradient between the predetermined breaking layer and the dielectric layers. In this case, the material which has migrated from a predetermined breaking layer can diffuse through one or more dielectric layers of the multilayer component.

If the dielectric layers are regarded macroscopically as porous walls by means of which the electrode layers are spaced apart from one another, the diffusion through this "wall" can be regarded as a diffusion caused by a concentration or activity gradient which has a concentration-compensating effect. The outdiffusible material of the predetermined breaking layer can therefore diffuse into another region of the multilayer component by means of an osmotic effect.

In accordance with one embodiment of the multilayer component, a material that forms or concomitantly forms the predetermined breaking layer is electrically conductive and in this case a higher proportion of the material is contained in the electrode layers. The material could be silver, for example. In an example, the predetermined breaking layer contains between 85% and 99% silver and between 1% and 15% palladium and the electrode layer contains between 1% and 15% silver and between 85% and 99% palladium. By way of another example, the electrode layers could have a proportion of 75% silver and a proportion of 25% palladium. In this case, the predetermined breaking layer could have a proportion of silver >75%, where the predetermined breaking layer could furthermore also contain different materials than palladium which is contained in the electrode layers. Preferably, consideration is given to keeping down the proportion of comparatively expensive noble metals in the predetermined breaking layers.

In accordance with one embodiment, the predetermined breaking layer is porous. If it contains a metal, then the proportion or the material microstructure of the metal should be configured in such a way that the predetermined breaking layer has no or at least only a slight effect on the distribution of electromagnetic fields in the multilayer component. It is preferred for the predetermined breaking layer not to function as an electrode or to have no electrode function. In this case, in accordance with one embodiment of the multilayer component, the predetermined breaking layer is not electrically contact-connected to external contacts.

In accordance with one preferred embodiment of the multilayer component, at least one predetermined breaking layer is adjacent to each electrode layer in the stacking direction. Moreover, a plurality of predetermined breaking layers can lie laterally opposite one another on a plane of the stack, with the result that the multilayer component can crack from a plurality of side areas in order thus to reduce mechanical stresses effectively.

In a further embodiment of the multilayer component, the dielectric layers which are provided with printed electrode material forming an electrode layer have, on their top side alongside the electrode layer, an edge region which is preferably situated in the inactive zone. In comparison with an adjacent electrode layer, the edge region has a higher proportion of readily diffusible material, such as silver, for example, and comprises a predetermined breaking layer.

The predetermined breaking layer is preferably arranged alongside the electrode layer in the same plane and is electrically insulated therefrom by means of a dielectric, for example, by means of an air gap or by means of a ceramic material. In addition to the dielectric layers which are provided with a predetermined breaking layer alongside the electrode layer, the multilayer component can also have dielectric layers in an adjacent plane which have only a predetermined breaking layer arranged for the most part in an inactive region.

The predetermined breaking layer arranged alongside an electrode layer in the same plane, together with the further predetermined breaking layers in other planes of the multilayer component, reduces the mechanical stresses within the inactive zone and thereby increases the reliability of the multilayer component.

The additional predetermined breaking layer alongside the electrode layer has the advantage that during lamination the individual layers of the multilayer component do not have to compensate for thickness differences in the stacking direction as a result of their own plastic deformation. A plastic deformation could arise if a dielectric or piezoceramic layer lying on an electrode layer were bent down onto the more deeply situated top side of an adjacent dielectric layer lying underneath. Each dielectric layer bent in this way is thus under mechanical stress which could cause cracks. If this effect is multiplied over a plurality of layers of the multilayer component, then this could lead to different height dimensions of the multilayer component and bring about mechanical stresses over the entire height of the multilayer component. However, if a predetermined breaking layer is additionally arranged alongside the electrode layer in the edge region of the dielectric layer, the multilayer component will essentially acquire a uniform height, with the result that mechanical stresses can be avoided.

A method for producing a piezoelectric multilayer component is additionally specified, wherein first piezoceramic sheets are printed with a predetermined breaking material, the microstructure of which becomes mechanically unstable in the course of the production of the multilayer component and leaves a predetermined breaking layer in the process. The first piezoceramic sheets and second piezoceramic sheets having electrode layers are provided or joined together to form a stack in such a way that the area of a predetermined breaking layer in orthogonal projection has no area of overlap with an adjacent electrode layer. Consequently, the predetermined breaking layers are intended always to be situated in an inactive zone of the multilayer component.

In accordance with one embodiment of the production method, a third or further piezoceramic sheet is printed both with electrode material and with predetermined breaking material in such a way that the third piezoceramic sheet is provided both with an electrode layer and with a predetermined breaking layer, wherein the layers are arranged alongside one another in the same plane.

The stack can subsequently be sintered to form a monolithic multilayer component. In this case, first, second and third piezoceramic sheets can be stacked together alternately and in any desired order. Prior to sintering, the stack could be subjected to binder removal in a drying process.

In accordance with one embodiment of the method, the mechanical instability of a predetermined breaking layer is achieved during the heating of the multilayer component. This could involve a separate heating operation specifically suitable for this purpose. Alternatively, the mechanical instability of the predetermined breaking layer could be achieved during the sintering of the multilayer component.

In accordance with one embodiment of the production method, the first and the second piezoceramic sheets are individually stacked alternately one above another. Consequently, every second piezoceramic layer of the multilayer component has a predetermined breaking layer. Alternatively, however, by means of a different process, a plurality of second piezoceramic sheets could be provided to form a partial stack and then a first piezoceramic sheet with printed predetermined breaking material could be placed onto the partial stack. The process can be repeated until a stack formed from partial stacks arises.

In accordance with one embodiment, the predetermined breaking material leaves a porous predetermined breaking layer on the first piezoceramic layers in the course of the production method. This can be achieved in various ways, by way of example, the material or the material composition could diffuse partly from the predetermined breaking layer. However, the material composition could also be constituted in such a way that, at a specific temperature, part of the composition volatilizes and then leaves holes or pores. Organic material could be involved in this case. It is preferred for a lower concentration of the predetermined breaking material to be present in a multilayer component region which is free of a predetermined breaking layer, with the result that the predetermined breaking material can diffuse from the predetermined breaking layer into a multilayer component region having the lower concentration of the predetermined breaking material.

BRIEF DESCRIPTION OF THE DRAWINGS

The subject matters described are explained in more detail on the basis of the following exemplary embodiments and figures, in which.

Figure 1:
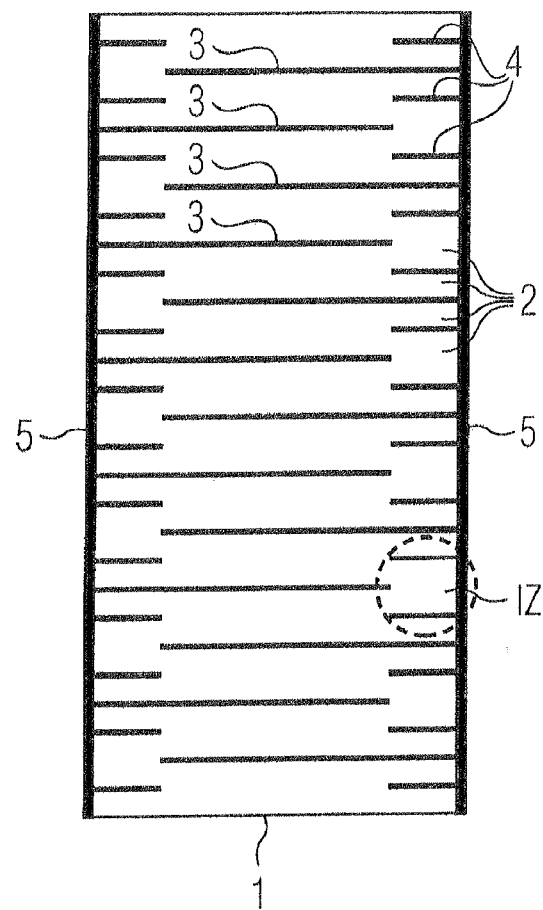
FIG. 1 shows a multilayer component including a stack of dielectric layers, electrode layers and predetermined breaking layers.

The following list of reference symbols can be used in conjunction with the drawings:
1 Base body
2 Dielectric layers
2a Dielectric layer with predetermined breaking material printed thereon
2b Dielectric layer with electrode material printed thereon
3 Electrode layers
4 Mechanically unstable layers
5 External contacts
IZ Inactive zone

DETAILED DESCRIPTION OF ILLUSTRATIVE EMBODIMENTS

FIG. 1 shows a piezoelectric multilayer component comprising a monolithically constructed base body 1 having a stack of piezoceramic layers 2 and electrode layers 3. Every second dielectric layer is printed with a predetermined breaking layer 4 in the edge region. By contrast, the other dielectric layers 2 are printed with electrode structures or layers 3 right into the inner region. The predetermined breaking layers 4 are arranged in the inactive zone IZ of the stack, where no two electrode layers 3 which are adjacent in the stacking direction overlap in orthogonal projection. The electrode layers 3 and the predetermined breaking layers 4 both contain electrically conductive materials, but in different proportions.

By way of example, the electrode layers 3 contain silver to the extent of 20% and palladium to the extent of 80%. By contrast, the predetermined breaking layers 4 contain more than 20% silver, for example, 70% silver, and only 30% palladium. The percentages of silver and palladium are either a percentage by weight or a molar percentage. Since the elements silver and palladium have similar molecular weights, the difference between weight percentage and molar percentage should be negligible.

On the basis of the resultant concentration gradient of silver, the mobile silver can pass or diffuse from the predetermined breaking layer 4 to an adjacent electrode layer 3. This effect can already begin before a sintering operation. A predetermined breaking layer which has no continuous structure suitable as an electrode and is mechanically unstable is left in the process. In particular, a porous predetermined breaking layer 4 is left.

Figure 2:
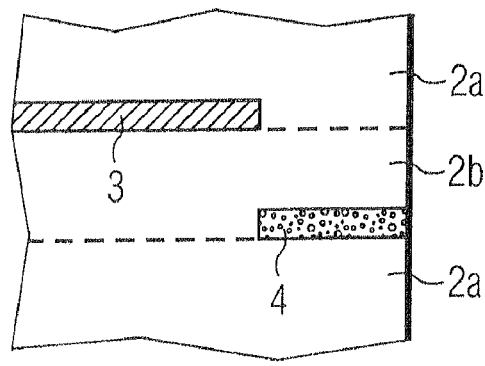
FIG. 2 shows an exploded illustration of part of the multilayer component shown by FIG. 1.

FIG. 2 shows an exploded illustration of a region of the multilayer component shown by FIG. 1. Piezoceramic layers 2 which are adjacent in the stacking direction are shown, wherein a first piezoceramic layer 2a is provided with a predetermined breaking layer 4, the material of which has already partly outdiffused and has thus left pores or indentations or cutouts. A second piezoceramic layer 2b is arranged on the first piezoceramic layer 2a, the second piezoceramic layer being provided with a printed electrode layer 3. The electrode layer is contact-connected at one end to an external contact 5 of the multilayer component.

Figure 3:
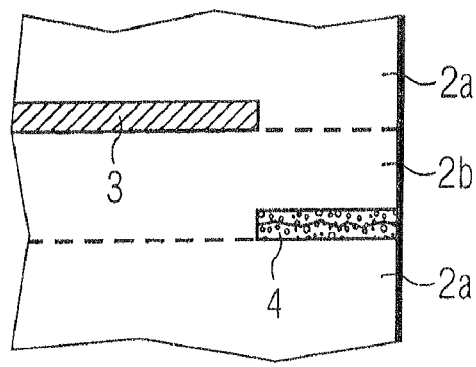
FIG. 3 shows the state of part of the multilayer component shown by FIG. 1 when a predetermined breaking layer cracks.

FIG. 3 shows the region of the piezoelectric multilayer component shown by FIG. 2, but this time with a slot depicted dark, which represents a crack produced under a specific tensile load. In this case, the crack runs at most as far as that end of the predetermined breaking layer 4 which faces the inner part of the multilayer component. The crack runs through the predetermined breaking layer 4; but in this case neither at the interface between the piezoceramic layer 2a or respectively 2b and the predetermined breaking layer 4 nor through the piezoceramic layers themselves.

Figure 4:
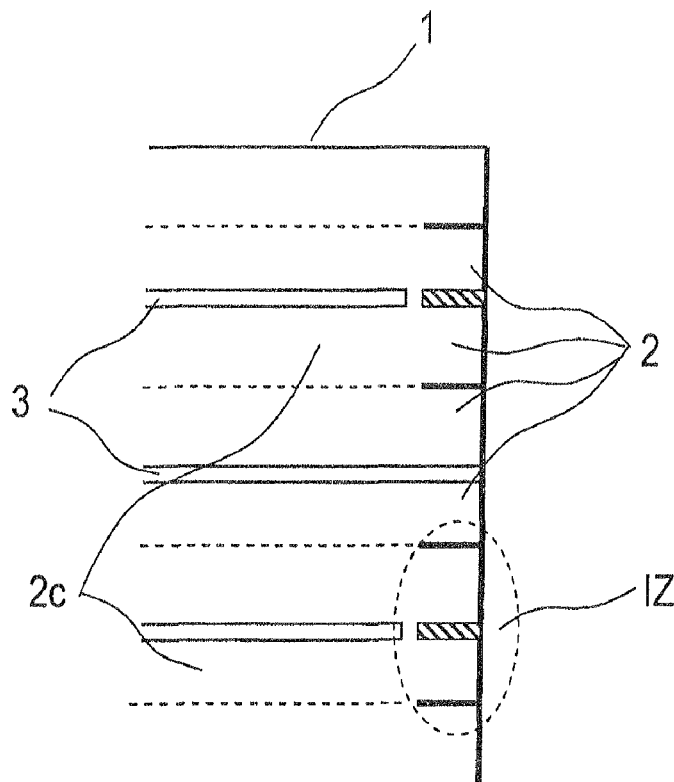
FIG. 4 shows a further embodiment of the multilayer component wherein the predetermined breaking layers lie in the plane of the electrode layer.

FIG. 4 shows a further embodiment of the piezoelectric multilayer component comprising a monolithically constructed base body 1 having a stack of piezoceramic layers 2 and electrode layers 3. Every second dielectric layer 2a is printed with a predetermined breaking layer 4 in a corner of its edge region. The intervening dielectric layers 2b are printed with electrode structures or layers 3 apart from an edge region. A dielectric layer 2c provided with an electrode layer 3 has a predetermined breaking layer 4, containing predetermined breaking material, preferably in the edge region lying in the region of the inactive zone IZ. The predetermined breaking layers 4 are arranged in the inactive zone IZ of the stack. The predetermined breaking layers 4 preferably contain a higher proportion of readily diffusible materials, such as a higher proportion of silver, for example, than an adjacent electrode layer 3. The edge regions of the dielectric layers 2c provided with a predetermined breaking layer 4 are electrically insulated from the electrode layer 3, with the result that a short circuit between the electrode layer 3 and the predetermined breaking layer 4 cannot occur.

Figure 5:
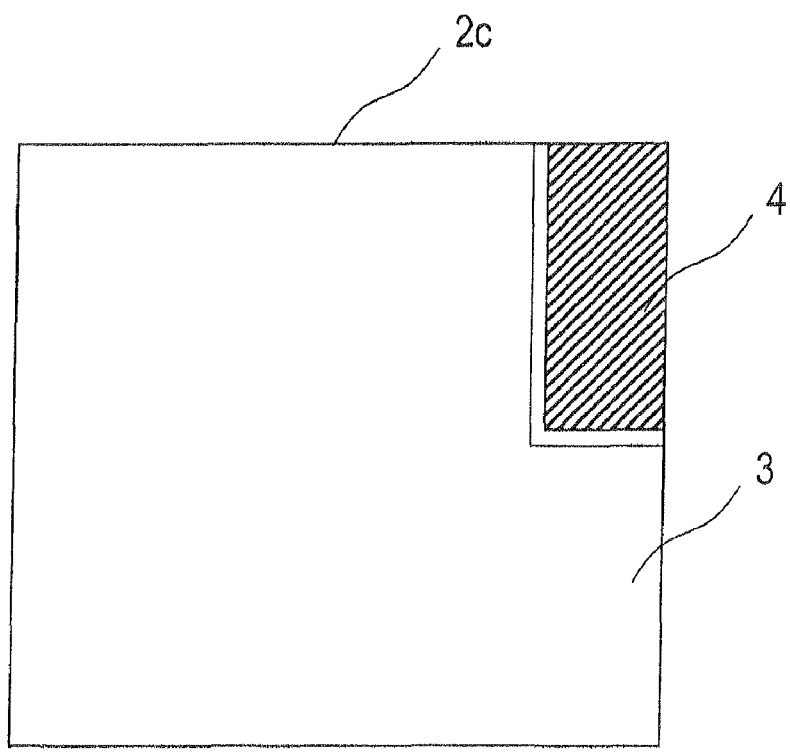
FIG. 5 shows a plan view illustration of the embodiment in accordance with FIG. 4.

FIG. 5 shows the plan view of a dielectric layer 2c with an electrode layer 3 and a predetermined breaking layer 4 printed on in an edge region. The predetermined breaking layer 4 is electrically insulated from the electrode layer 3. The predetermined breaking layer 4 preferably has the form of a rectangle. The edge of the electrode layer 3 runs, with a spacing of a narrow insulating gap, at least on two sides substantially parallel to the edge of the predetermined breaking layer 4, such that the electrode layer 3 could have the form of an "L", for example. Mutually facing edges of the electrode layer 3 and/or of the predetermined breaking layer 4 thus show complementary courses with respect to one another.

The multilayer component is preferably produced as follows.

First and second piezoceramic green sheets are provided, the compositions of which can be identical. They preferably contain a PZT ceramic in each. For better handleability of the green sheets, they can each contain an organic binder. First piezoceramic green sheets are printed with a predetermined breaking material and second piezoceramic green sheets are printed with an electrode material. Printed predetermined breaking material and printed electrode material respectively form a predetermined breaking layer and an electrode layer on the respective piezoceramic green sheets. The green sheets are printed and trimmed in such a way that the predetermined breaking material is only arranged in the edge region of a first piezoceramic green sheet and the electrode material extends from the edge of a second piezoceramic green sheet right into the central region of the green sheet. The predetermined breaking material consists of 90% silver and 10% palladium. The electrode material consists of 75% palladium and 25% silver. Alternatively, the predetermined breaking material could consist of 98% silver and 2% palladium and the electrode material could consist of 90% silver and 10% palladium.

First and second green sheets are subsequently stacked alternately one above another in order to form a green stack having a piezoelectrically active region and a piezoelectrically inactive region. The stack is subsequently subjected to binder removal and sintered. At the latest during the sintering process, the silver diffuses from the predetermined breaking layer to an electrode layer. In this case, silver is accumulated in and/or at the electrode layer; however the silver does not adversely affect the functionality of the electrode layer. By contrast, the palladium remains present in both layers or diffuses to a lesser extent since it has a diffusion coefficient smaller by 1 to 2 orders of magnitude than that of silver.

After the sintering process, external contacts can be applied as layers on side areas of the multilayer component and the electrode layers can thereby be contact-connected. If appropriate, the respective side areas of the sintered stack can be ground in this case in order to expose the electrode layers for simplified contact-connection to the external contacts.

What is claimed is:

1. A piezoelectric multilayer component, comprising a base body comprising a stack of dielectric layers, electrode layers and at least one predetermined breaking layer,
   wherein the predetermined breaking layer is arranged at least for the most part in an inactive zone,
   wherein the predetermined breaking layer cracks under specific tensile loads, and
   wherein the at least one predetermined breaking layer contains a predetermined breaking material which is diffusible through the dielectric layers during production of the stack.

2. The piezoelectric multilayer component as claimed in claim 1, wherein the at least one predetermined breaking layer contains a combination of predetermined breaking material which is more readily diffusible and that which is more poorly diffusible through the dielectric layers during the production of the stack.

3. The piezoelectric multilayer component as claimed in claim 1, wherein a higher proportion of the diffusible predetermined breaking material of the at least one predetermined breaking layer is contained in the electrode layers.

4. The piezoelectric multilayer component as claimed in claim 1, wherein the at least one predetermined breaking layer comprises a plurality of breaking layers and wherein a predetermined breaking layer is adjacent to each electrode layer in a stacking direction.

5. The piezoelectric multilayer component as claimed in claim 1, wherein the at least one predetermined breaking layer comprises a plurality of predetermined breaking layers lying laterally opposite one another on a plane of the stack.

6. The piezoelectric multilayer component as claimed in claim 1, wherein the at least one predetermined breaking layer is porous.

7. The piezoelectric multilayer component as claimed in claim 1, wherein the at least one predetermined breaking layer contains between 85 and 99% silver and the electrode layers between 15 and 1% silver.

8. The piezoelectric multilayer component as claimed in claim 7, wherein the at least one predetermined breaking layer contains between 15% and 1% palladium and the electrode layers between 85 and 99% palladium.

9. The piezoelectric multilayer component as claimed in claim 1, wherein a predetermined breaking layer is arranged alongside an electrode layer in a same plane of the multilayer component and both are electrically insulated from one another by a dielectric.

10. The piezoelectric multilayer component as claimed in claim 9, wherein mutually facing edges of the electrode layers and of the predetermined breaking layer show complementary courses.

11. A piezoelectric multilayer component, comprising:
   a base body;
   a plurality of dielectric layers disposed within the base body;

a plurality of electrode layers disposed within the base body, the electrode layers and the dielectric layers being arranged in a stack;

at least one predetermined breaking layer arranged at least for the most part in an inactive zone of the base body, wherein the predetermined breaking layer cracks under specific tensile loads;

wherein the predetermined breaking layer contains between 85% and 99% silver and between 1% and 15% palladium and wherein the electrode layer contains between 1% and 15% silver and between 85% and 99% palladium.

12. The piezoelectric multilayer component as claimed in claim 11, wherein the at least one predetermined breaking layer comprises a plurality of predetermined breaking layers such that a predetermined breaking layer is adjacent to each electrode layer in a stacking direction.

13. The piezoelectric multilayer component as claimed in claim 11, wherein the predetermined breaking layer is arranged alongside an electrode layer in a same plane of the multilayer component and both are electrically insulated from one another by a dielectric.

14. The piezoelectric multilayer component as claimed in claim 11, wherein the predetermined breaking layer is porous.

15. A method for producing a piezoelectric multilayer component, the method comprising:

forming a predetermined breaking layer by printing first piezoceramic sheets with a predetermined breaking material having a microstructure that becomes mechanically unstable during production of the multilayer component, providing first piezoceramic sheets and second piezoceramic sheets having electrode layers so as to form a stack in such a way that an area of a predetermined breaking layer in orthogonal projection has no area of overlap with an adjacent electrode layer, and sintering the stack to form a monolithic multilayer component wherein the predetermined breaking material diffuses from the predetermined breaking layer into a multilayer component region having a lower concentration of the predetermined breaking material.

16. The method as claimed in claim 15, wherein the production of the mechanical instability of the predetermined breaking layer takes place during the sintering of the stack.

17. The method as claimed in claim 15, wherein the predetermined breaking material leaves a porous predetermined breaking layer on the first piezoceramic sheets in the course of the production method.

18. A piezoelectric multilayer component, comprising a base body comprising a stack of dielectric layers, electrode layers and at least one predetermined breaking layer, wherein the predetermined breaking layer is arranged at least for the most part in an inactive zone, wherein the predetermined breaking layer cracks under specific tensile loads, and wherein the at least one predetermined breaking layer contains between 85 and 99% silver and the electrode layers between 15 and 1% silver.

19. The piezoelectric multilayer component as claimed in claim 7, wherein the at least one predetermined breaking layer contains between 15% and 1% palladium and the electrode layers between 85 and 99% palladium.

20. A piezoelectric multilayer component, comprising a base body comprising a stack of dielectric layers, electrode layers and at least one predetermined breaking layer, wherein the predetermined breaking layer is arranged at least for the most part in an inactive zone, wherein the predetermined breaking layer cracks under specific tensile loads, and wherein the predetermined breaking layer comprises a porous metal-containing layer.

* * * * *